(12) United States Patent
Kim et al.

(10) Patent No.: US 7,443,697 B2
(45) Date of Patent: Oct. 28, 2008

(54) ELECTRONIC DEVICE HAVING BEZEL STRUCTURE

(75) Inventors: Hee-man Kim, Suwon-si (KR); Ogawa Atsuhisu, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 497 days.

(21) Appl. No.: 10/954,295

(22) Filed: Oct. 1, 2004

(65) Prior Publication Data
US 2005/0087365 A1 Apr. 28, 2005

(30) Foreign Application Priority Data
Oct. 1, 2003 (KR) .................... 10-2003-0068318

(51) Int. Cl.
*H05K 5/00* (2006.01)
*H05K 9/00* (2006.01)
*H02B 1/01* (2006.01)
*H04N 5/65* (2006.01)
*H01J 1/52* (2006.01)

(52) U.S. Cl. .............. 361/829; 361/681; 361/816; 361/818; 348/819; 315/85

(58) Field of Classification Search ............. 361/686, 361/681–682, 816–818, 821, 824–825, 829–830; 312/223.5; 315/85, 8; 313/479; 348/819–820
See application file for complete search history.

(56) References Cited

U.S. PATENT DOCUMENTS 4,380,715 A * 4/1983 Postma .................... 315/3
4,435,820 A * 3/1984 Edgerley .................. 373/161
4,661,655 A * 4/1987 Gibson et al. ............ 178/18.05
4,871,969 A * 10/1989 Roemer et al. ............. 324/318
5,139,850 A * 8/1992 Clarke et al. .............. 428/192
5,260,626 A * 11/1993 Takase et al. .............. 315/85
5,365,285 A * 11/1994 Kizuya et al. .............. 348/818
5,400,088 A * 3/1995 Jones ...................... 348/819
5,485,056 A * 1/1996 Sasaki et al. .............. 315/8

(Continued)

FOREIGN PATENT DOCUMENTS

JP 10-143083 5/1998

(Continued)

OTHER PUBLICATIONS

-International Search Report (International Application No. PCT/KR2004/002480) filed On Sep. 24, 2004.

(Continued)

*Primary Examiner*—Jayprakash N Gandhi
*Assistant Examiner*—Bradley H Thomas
(74) *Attorney, Agent, or Firm*—Stanzione & Kim, LLP

(57) ABSTRACT

An electronic device having a bezel structure includes a case, an installation element, part of which is installed to the case, a conductive bezel having a loop shape to fixedly couple the installation element to the case, and an electronic unit provided in the case. The conductive bezel includes a support portion to directly support a circumference of the installation element, and a separation portion formed at one or more positions of the support portion to separate the support portion by a predetermined interval to restrict formation of an electrical loop.

2 Claims, 8 Drawing Sheets

U.S. PATENT DOCUMENTS

| | | | | |
|---|---|---|---|---|
| 5,521,612 | A * | 5/1996 | Johansson | 345/102 |
| 5,534,756 | A | 7/1996 | Beeteson et al. | |
| 5,561,333 | A * | 10/1996 | Darius | 307/91 |
| 5,568,112 | A * | 10/1996 | Cure | 335/214 |
| 5,594,615 | A | 1/1997 | Spijkerman et al. | |
| 5,742,128 | A * | 4/1998 | Bearce et al. | 315/8 |
| 5,789,872 | A * | 8/1998 | Kohga et al. | 315/370 |
| 5,818,171 | A * | 10/1998 | Kim et al. | 315/8 |
| 5,914,567 | A * | 6/1999 | Tanaka | 315/85 |
| 5,969,775 | A * | 10/1999 | Jeong | 348/819 |
| 5,990,625 | A * | 11/1999 | Meissner et al. | 315/85 |
| 6,147,454 | A * | 11/2000 | Uchida et al. | 315/85 |
| 6,249,006 | B1 * | 6/2001 | Sakiyama | 250/505.1 |
| 6,639,144 | B1 * | 10/2003 | Toh | 174/350 |
| 6,801,268 | B2 * | 10/2004 | Huang et al. | 349/58 |
| 6,812,442 | B2 * | 11/2004 | Kim et al. | 219/742 |
| 6,850,287 | B1 * | 2/2005 | Sugiura et al. | 348/818 |
| 6,884,936 | B2 * | 4/2005 | Takahashi et al. | 174/389 |
| 2002/0041343 | A1 * | 4/2002 | Ikui et al. | 348/819 |
| 2002/0109978 | A1 * | 8/2002 | Henry | 361/818 |
| 2002/0126236 | A1 * | 9/2002 | Hiratsuka et al. | 349/58 |
| 2003/0184523 | A1 * | 10/2003 | Badaye et al. | 345/173 |
| 2004/0189880 | A1 * | 9/2004 | Lee et al. | 348/820 |

FOREIGN PATENT DOCUMENTS

| | | |
|---|---|---|
| JP | 10-173379 | 6/1998 |
| JP | 10-173380 | 6/1998 |
| JP | 2000-299594 | 10/2000 |
| KR | 1999-15876 | 5/1999 |
| KR | 2000-32929 A | 6/2000 |

OTHER PUBLICATIONS

Chinese Office Action dated Jul. 27, 2007 issued in CN 200480028845.6.

* cited by examiner

ELECTRONIC DEVICE HAVING BEZEL STRUCTURE

CROSS-REFERENCE TO RELATED APPLICATIONS

This application claims the priority of Korean Patent Application No. 2003-68318, filed on Oct. 1, 2003, in the Korean Intellectual Property Office, the disclosure of which is incorporated herein in its entirety by reference.

BACKGROUND OF THE INVENTION

1. Field of the Invention

The present invention relates to an electronic device having a bezel structure to fix constituent elements, and more particularly, to an electronic device having a bezel structure which can restrict radiation of an electromagnetic field from a loop formed by the bezel.

2. Description of the Related Art

In general, electronic devices, such as screen incorporated projectors or LCD monitors, use a metal bezel to firmly support constituent elements, such as a screen. The bezel has a loop shape because a central portion of one of the constituent elements must not be blocked by the bezel.

FIG. 1 is a perspective view illustrating a general projection television as an example of an electronic device. Referring to FIG. 1, the projection television includes a case 1, a screen 3 installed to the case 1, a loop shaped bezel 5 to fix the screen 3 to the case 1, and an electronic unit 7 provided in the case 1. The case 1 and the screen 3 are formed of an insulation material such as plastic while the bezel 5 is formed of a conductive material, such as aluminum. The electronic unit 7 includes an optical projection unit, such as an optical system for projection, and an electronic circuit to drive the optical projection unit.

In the electronic device having the above structure, the electronic unit 7 including the electronic circuit is arranged close to the bezel 5 as a size of the electronic device decreases. When the electronic unit 7 is arranged close to the bezel 5, as shown in FIG. 2, a near field 9 generated by the electronic unit 7 is electronically coupled to the bezel 5 having a loop shape. Thus, the bezel 5 forms a loop antenna at and around a resonance frequency.

Assuming that a total length of a loop formed by the bezel 5 is $L_1$, the following Equation 1 is satisfied.

$$L_1 = k \times \lambda_0 \quad \text{[Equation 1]}$$

Here, the total length of the loop "$L_1$" is twice a sum of a width W and a height H of the bezel 5. That is, $L_1=2\times(H+W)$. "k" denotes an expansion rate of a wavelength and is not less than 1.0 in a free space. The expansion rate "k" changes according to a size of the bezel 5 and the electronic circuit 7 arranged around the bezel 5. "$\lambda_0$" denotes a resonance wavelength.

When the bezel 5 having the above structure is employed, the bezel 5 resonates at the resonance wavelength "$\lambda_0$" and a minimum resonance frequency f is about $300/\lambda_0$ MHz. Accordingly, the near field 9 generated by the electronic unit 7 at and around the resonance frequency increases so that the increased near field 9 causes problems in that electronic field radiation and electro-magnetic interference (EMI) increase.

In order to solve the above problems, a conventional electronic device has been suggested to shield the electronic circuit or the electronic unit and to form the bezel supporting the screen with an insulation material. Also, in order to solve a problem in the strength of the bezel 5, an additional metal plate to reinforce the bezel 5 is provided in the conventional electronic device. The above solutions, however, have drawbacks, such as an increase in weight, deterioration in assembly, lowering in mechanical strength, and an increase in manufacturing cost.

SUMMARY OF THE INVENTION

In order to solve the above and/or other problems, it is an aspect of the present invention to provide an electronic device having an improved bezel structure to maintain a mechanical strength and an appearance and simultaneously reduce an electronic field radiation and EMI.

Additional aspects and advantages of the present general inventive concept will be set forth in part in the description which follows and, in part, will be obvious from the description, or may be learned by practice of the general inventive concept.

The foregoing and/or other aspects and advantages of the present general inventive concept may be achieved by providing an electronic device having a bezel structure including a case, an installation element, part of which is installed to the case, a conductive bezel having a loop shape to fix the installation element to the case, and an electronic unit provided in the case, wherein the conductive bezel may comprise a support portion to directly support an outside of the installation element, and a separation portion formed at one or more positions of the support portion to separate the support portion by a predetermined interval to restrict formation of an electrical loop.

In an aspect of the present general inventive concept, the electronic device having a bezel structure may further comprise a resistor and/or an inductor which is electrically connected to the support portion at one or more separation portions.

The foregoing and/or other aspects and advantages of the present general inventive concept may also be achieved by providing a bezel used with an electronic and/or electrical device having a case and an electronic unit disposed in the case, the bezel comprising a support portion having a loop shape to be fixedly coupled to a circumference of an installation element, and having both ends separated by a predetermined interval, and a separation portion formed between the both ends of the support portion to restrict formation of an electric loop.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which.

DETAILED DESCRIPTION OF THE PREFERRED EMBODIMENTS

Figure 1:
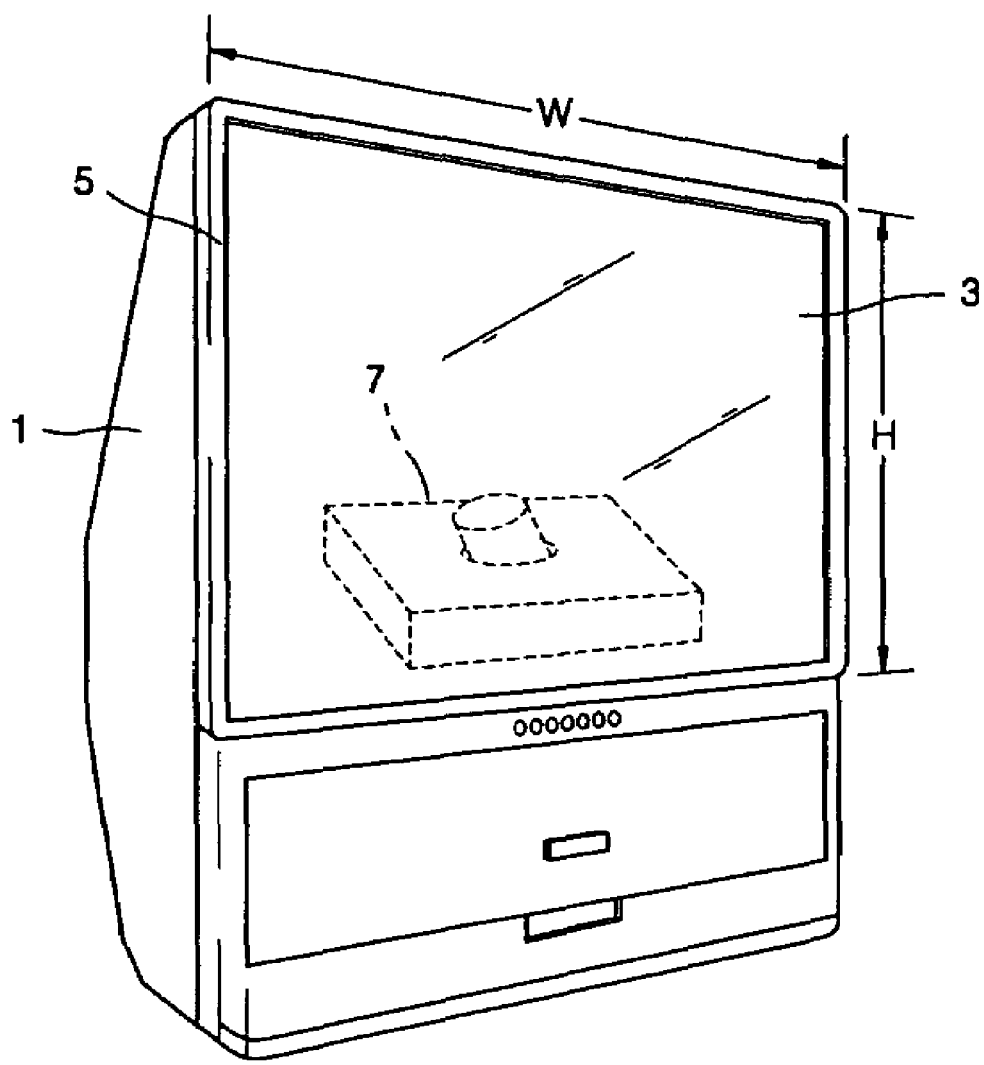
FIG. 1 is a perspective view illustrating a general projection television.
Figure 2:
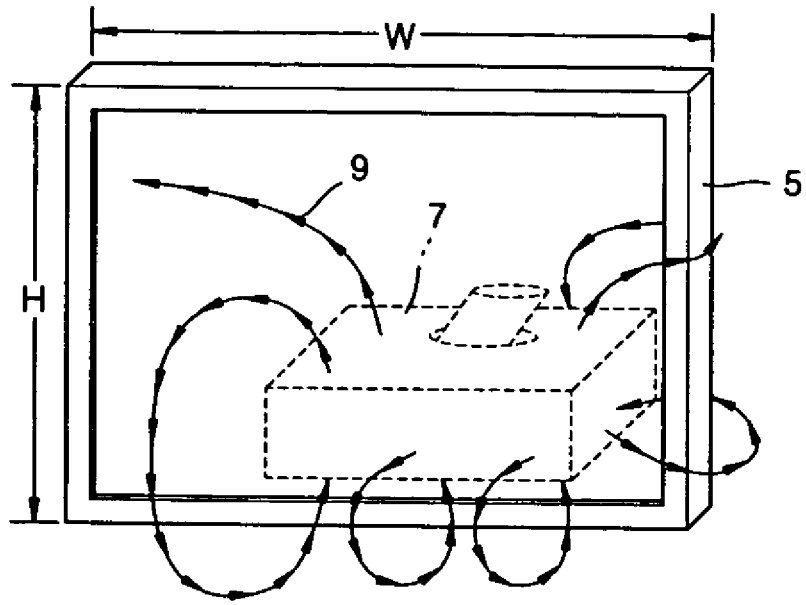
FIG. 2 is a perspective view illustrating a state of a loop shaped bezel reradiating an electronic field in the general projection television of FIG. 1.

Reference will now be made in detail to the embodiments of the present general inventive concept, examples of which are illustrated in the accompanying drawings, wherein like reference numerals refer to the like elements throughout. The embodiments are described below in order to explain the present general inventive concept by referring to the figures.

Figure 3:
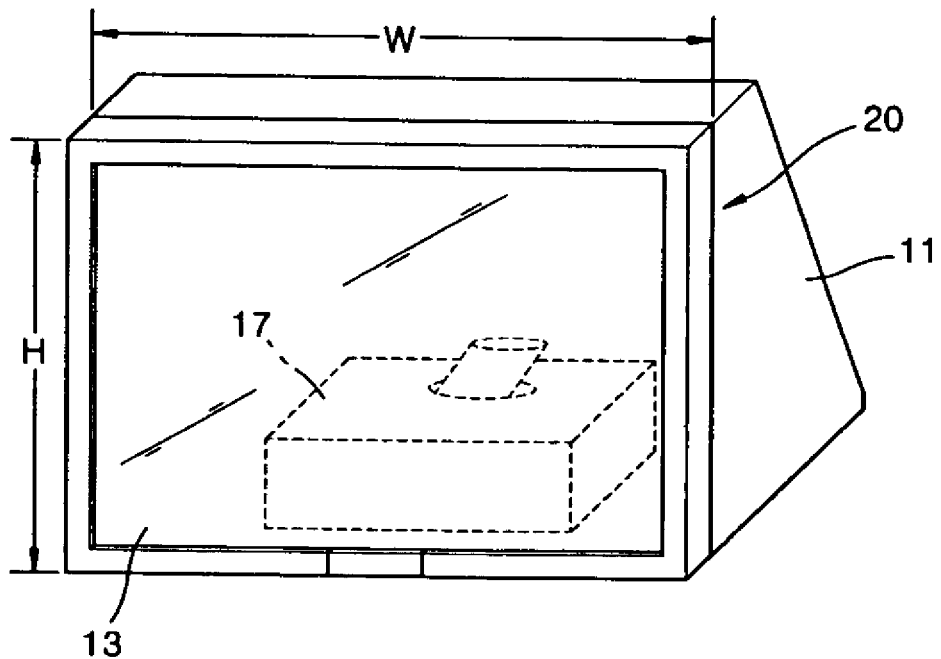
FIG. 3 is a perspective view illustrating an electronic device having a loop shaped conductive bezel according to an embodiment of the present general inventive concept.

FIG. 3 shows a projection television as an example of an electronic and/or electrical device according to an embodiment of the present general inventive concept. Referring to FIG. 3, the electronic device may include a case 11, an installation element 13, such as a screen, installed in the case 11, a bezel 20 to fixedly couple the installation element 13 to the case 11, and an electronic unit 17 provided inside the case 11.

The installation element 13 can be fixedly coupled to the case 11 by the bezel 20 to be exposed outside with respect to the case 11.

The bezel 20 may have a loop shape to encompass the installation element 13 and can be made of a conductive material, such as metal, to firmly support the installation element 13.

Figure 4:
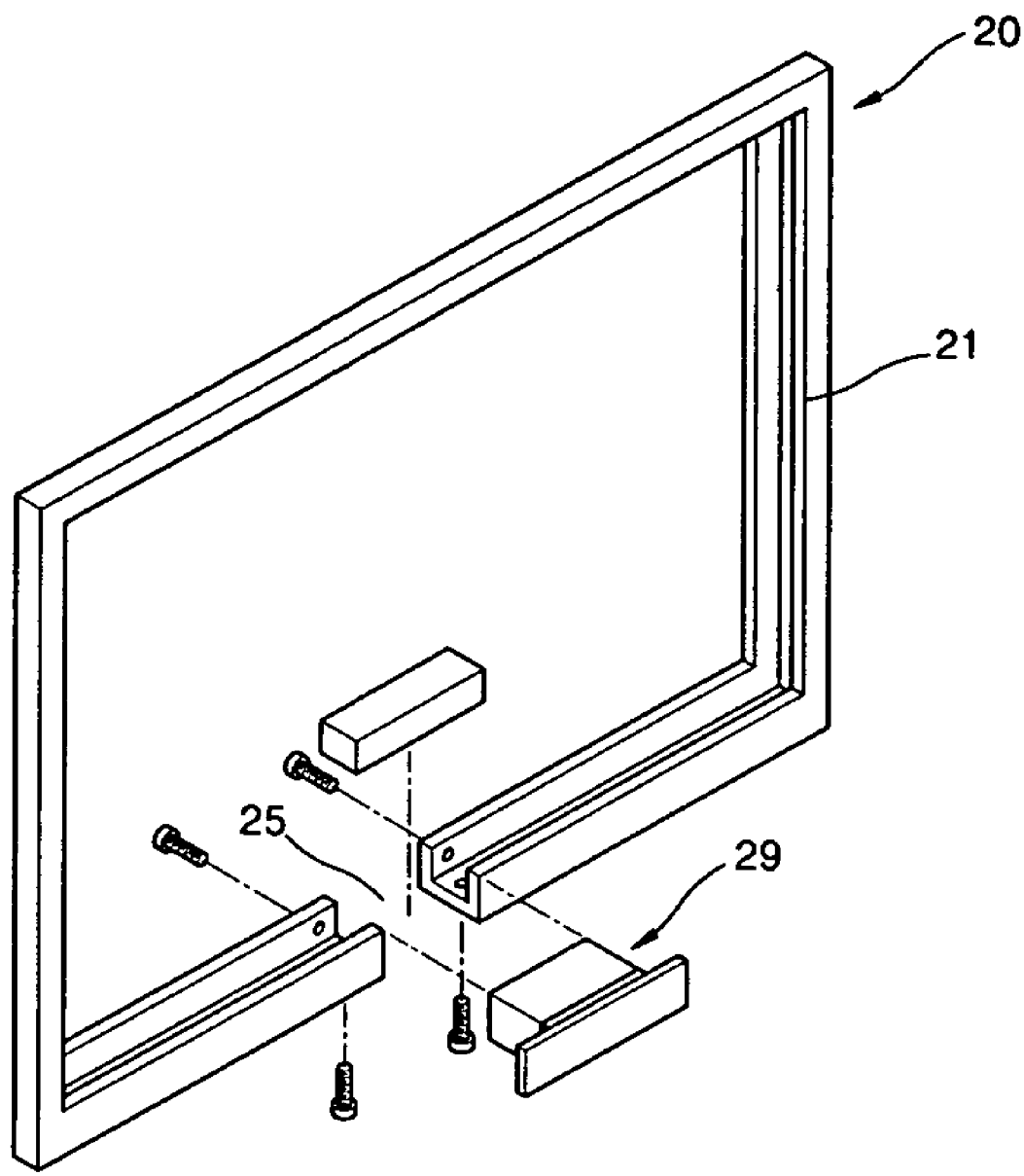
FIG. 4 is an exploded perspective view illustrating the loop shaped conductive bezel and an reinforcing member of the electronic device of FIG. 3.

Referring to FIG. 4, the bezel 20 may include a support portion 21 to directly support a circumference of the installation element 13, and a separation portion 25 separated from the support portion 21. The separation portion 25, as shown in FIG. 4, can be formed to electrically disconnect both ends of the supporting portion 21 by a predetermined width at a portion of the support portion 21. The width of the separation portion 25 can be formed not to generate an electrical loop.

By providing the separation portion 25, a loop current in a high frequency range generated due to an electrostatic capacity formed between both ends of the support portion 21 disposed at both sides of the separation portion 25 can be prevented. Thus, an increase in radiation of an electronic (or electromagnetic) field can be restricted (prevented).

An insulation reinforcing member 29 can be installed in a position corresponding to the separation portion 25. The insulation reinforcing member 29 can be coupled to the support portion 21 by screws to reinforce the support portion 21. The insulation reinforcing member 29 can be exposed outside and can prevent the separation portion 25 from being exposed so that an aesthetic outer appearance of the electronic device can be maintained.

Figure 5:
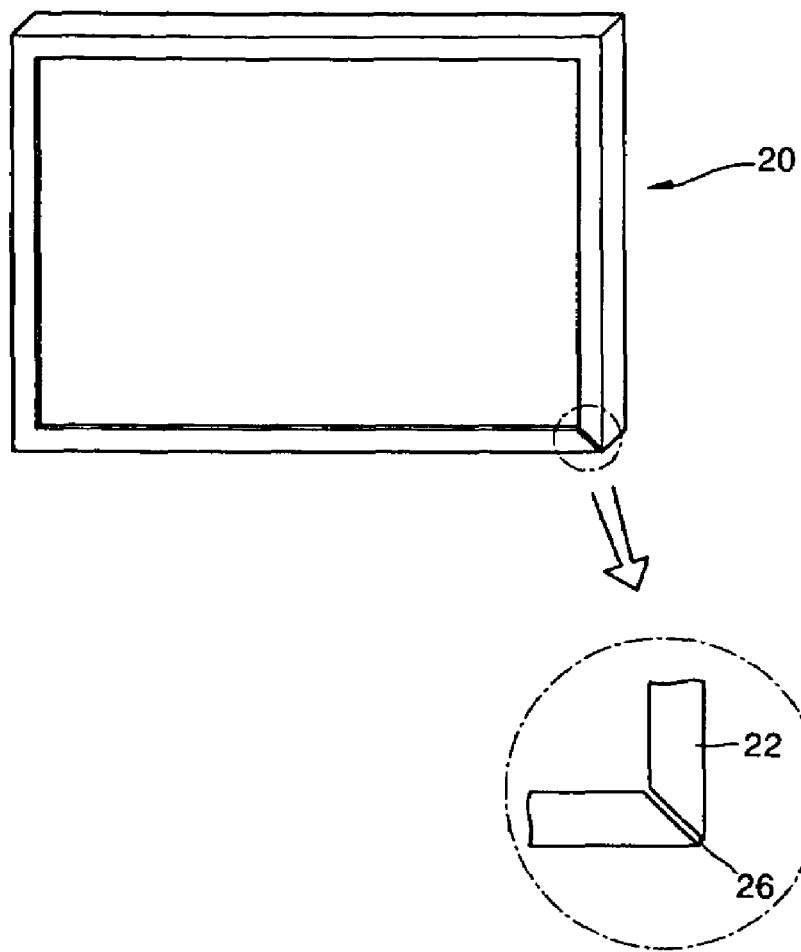
FIG. 5 is a perspective view illustrating a loop shaped conductive bezel used with an electronic device according to another embodiment of the present general inventive concept.

Referring to FIG. 5, a width of a separation portion 26 provided between both ends of a support portion 22 of a bezel 20. When the width of the separation portion 26 decreases, it causes a problem in that a loop antenna is formed in the bezel 20 having the decreased width. That is, the loop antenna formed in FIG. 5 can be represented by an equivalent circuit as shown in FIG. 6.

Figure 6:
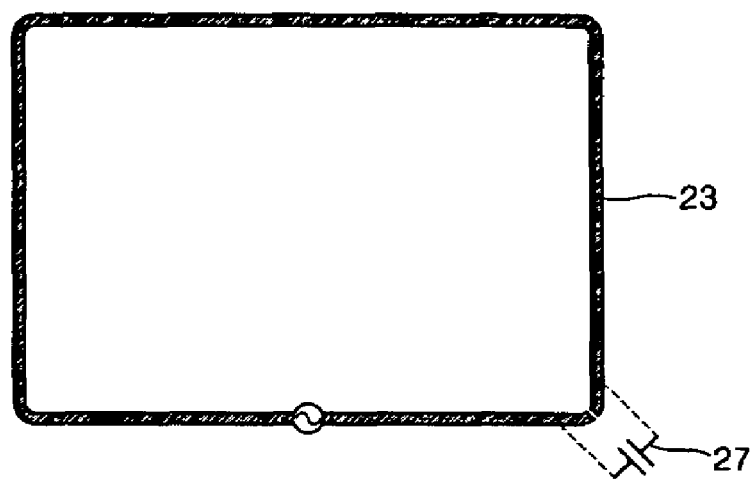
FIG. 6 is a view illustrating an equivalent circuit of the loop shaped conductive bezel of FIG. 5.

Referring to FIGS. 5 and 6, the support portion 22 can form a closed circuit 23 and the separation portion 26 functions as a capacitor 27, so that charges are accumulated in the separation portion 26.

Since the capacitor 27 maintains a short-circuit state in a high frequency range, a function of the bezel 20 as the loop antenna can be maintained when the separation portion 26 is not provided. An embodiment to reduce an effect by the electrostatic capacity when the width of the separation portion is narrow, will be described with reference to FIG. 7.

Figure 7:
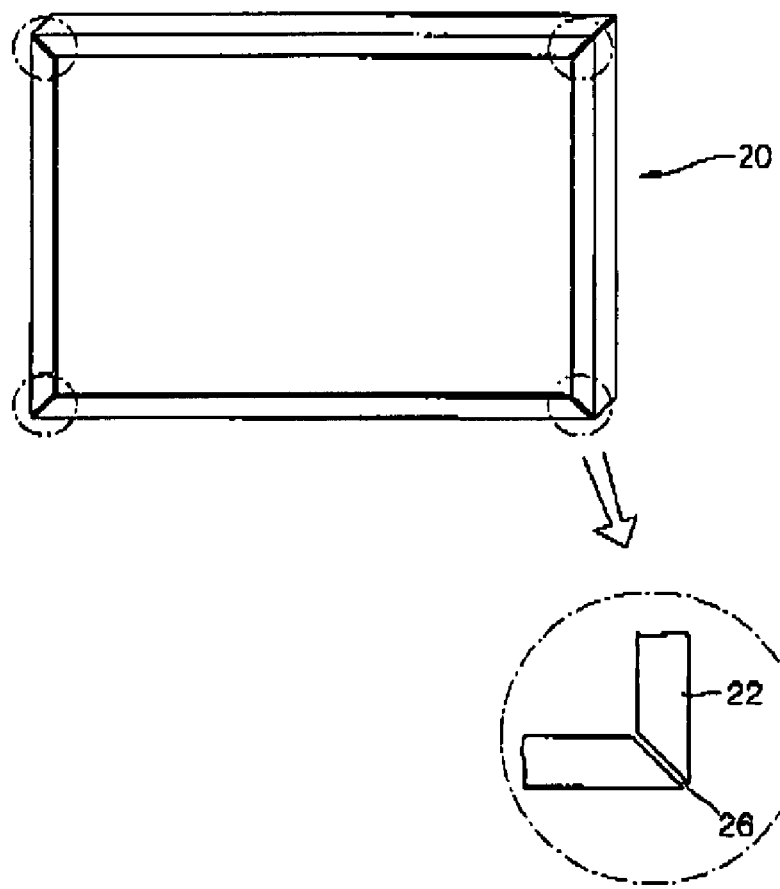
FIG. 7 is a perspective view illustrating a portion of a loop shaped conductive bezel used with an electronic device according to another embodiment of the present general inventive concept.

FIG. 7 is a perspective view illustrating a loop shaped conductive bezel 20 used with an electronic device to remove an effect generated due to the electrostatic capacity by lowering the electrostatic capacity while decreasing the width of the separation portion 26 according to another embodiment of the present general inventive concept. Referring to FIGS. 3 and 7, in order to reduce the electrostatic capacity, the separation portion 26 can be provided at four corners of the support portion 22 of the bezel 20 that has a rectangular shape in the electronic device. An equivalent circuit of this connection is shown in FIG. 8.

Figure 8:
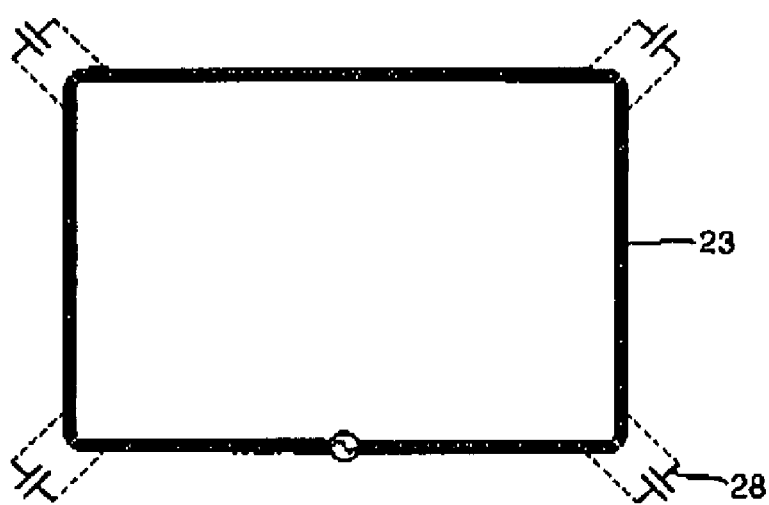
FIG. 8 is a view illustrating an equivalent circuit of the loop shaped conductive bezel of FIG. 7.

Referring to FIG. 8, since the equivalent circuit has four capacitors 28 connected in series, assuming that the electrostatic capacity of each of the capacitors 28 is C, the equivalent electrostatic capacity is C/4 so that a loop current decreases. That is, when the separation portion 26 is provided at "n" number of positions, the electrostatic capacity can be reduced to 1/n.

Although in FIGS. 7 and 8, the separation portions 26 are formed at four positions, however, the present general inventive concept is not limited thereto. In setting the number and position of the separation portions 26, a variety of modifications can be available according to a type of the electronic device.

That is, the formation of the loop antenna can be restricted (prevented) by setting the number and position of the separation portions according to the type of the electronic device, for example, a total length of the bezel, a closeness (distance) between the electronic circuit and the bezel, and a strength of an electronic wave radiated from the electronic circuit.

Figure 9:
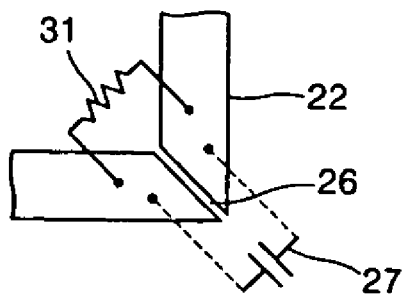
FIG. 9 is a view illustrating a portion of a loop shaped conductive bezel used with an electronic device according to another embodiment of the present general inventive concept.

Referring to FIG. 9, an electronic device according to another embodiment of the present general inventive concept may include a resistor 31 which is installed at one or more positions where separation portions 26 of a bezel are installed (provided). The resistor 31 can be electrically connected to both ends of the support portion 22 through each separation portion 26. In the electronic device, since a width of the separation portion 26 is relatively smaller, when the separation portion functions as a stray capacitor 27, a loop current flowing through the bezel 20 can be reduced.

Since a Q factor of a circuit formed by the bezel is inversely proportional to a resistance, the loop current can be reduced by electrically connecting the resistor 31 between both ends of the separation portion 26 to lower the Q factor. Thus, the radiation of an electronic field can be reduced.

Figure 10:
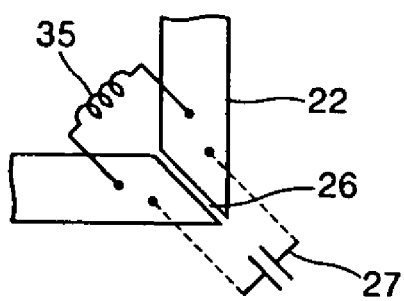
FIG. 10 is a view illustrating a portion of a loop shaped conductive bezel used with an electronic device according to another embodiment of the present general inventive concept.

Referring to FIG. 10, an electronic device according to another embodiment of the present general inventive concept may include an inductor 35 which is installed at one or more positions where separation portions 26 of a bezel are installed (provided). The inductor 35 can be electrically connected to both ends of support portion 22 through the separation portion 26 to form a parallel resonance circuit with a capacitor 27 between the electrostatic capacity of the separation portion 26 and the inductor 35. That is, in an equivalent circuit of the bezel having the above structure, the capacitor 27 and the inductor 35 can be connected in parallel to form the parallel resonance circuit. An inductance of the inductor 35 can be set such that a resonance frequency generated by the inductor 35 and the capacitor 27 is the same as that of the bezel 20.

By including the above inductor 35 to the bezel, an impedance of a circuit around the resonance frequency range increases, and accordingly the loop current decreases. As a result, radiation of an electronic field can be restricted (prevented).

Figure 11:
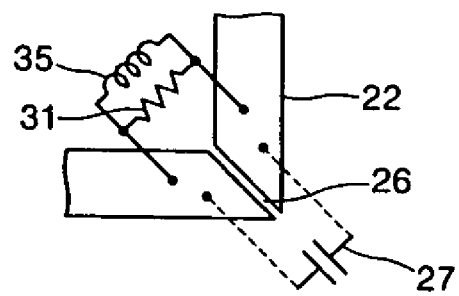
FIG. 11 is a view illustrating a portion of a loop shaped conductive bezel used with an electronic device according to another embodiment of the present general inventive concept.

Referring to FIG. 11, an electronic device according to another embodiment of the present general inventive concept may include both a resistor 31 and an inductor 35 which are installed at one or more positions where separation portions 26 of a bezel are installed (provided). The resistor 31 and the inductor 35 can be electrically connected in parallel to both ends of the support portion 22 through the separation portion 26 to form a parallel resonance circuit between the electrostatic capacity of the separation portion 26 and a combination of the resistor 31 and the inductor 35.

Figure 12:
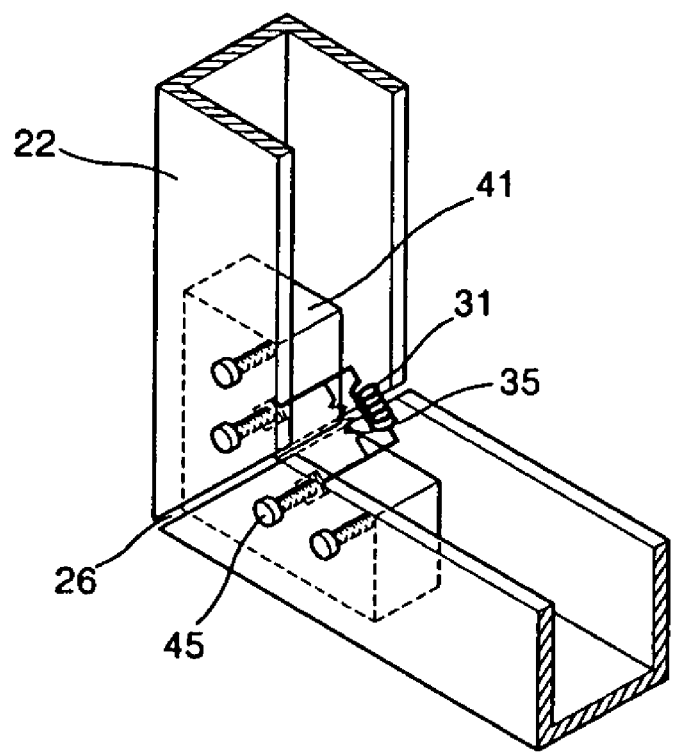
FIG. 12 is a perspective view illustrating a state of the loop shaped conductive bezel in which a resistor and an inductor shown in FIG. 11 are installed.

FIG. 12 is a perspective view illustrating a state of the loop shaped conductive bezel in which a resistor 31 and an inductor 35 are installed. Referring to FIG. 12, a lug 41 can be provided in an inner space of a support portion 22 and coupled to the support portion 22 using a plurality of screws 45. The screws 45 can be provided at the support portion 22 at either side of the separation portion 26 and made of a conductive material. The resistor 31 and the inductor 35 can be connected between the screws 45 separately disposed at either side of the support portion 22. Thus, both ends of the resistor 31 and the inductor 35 are electrically connected to the support portion 22.

Figure 13:
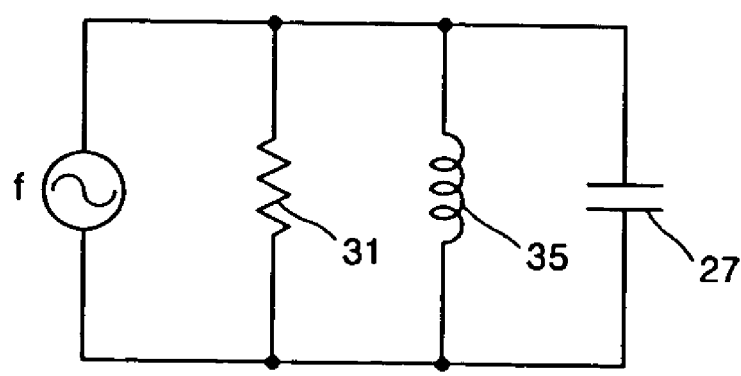
FIG. 13 is a view illustrating an equivalent circuit of the loop shaped conductive bezel of FIG. 11.

FIG. 13 is a view illustrating an equivalent circuit of the loop shaped conductive bezel of FIG. 11. Referring to FIGS. 11 and 13, the capacitor 27 formed by the separation portion 26 of FIG. 11, the resistor 31, and the inductor 35 are connected in parallel to form an RLC parallel resonance circuit. Values of the inductor 35 and the capacitor 27 can be used to determine the resonance frequency. The value of the inductor 35 can be set to be the same as that of an overall resonance frequency generated by the RLC circuit formed by the bezel. Accordingly, an impedance of an overall equivalent circuit can be increased and consequently, a current can be decreased so that the radiation of an electronic field around that resonance frequency is reduced.

A structure of a portion of the electronic device shown in FIG. 11 can be provided at either one of the separation portions or a plurality of the separation portions.

Although the embodiments includes a bezel used to fixedly couple the installation element, such as a screen, to the case, the present general inventive concept is not limited thereto and can be applied to loop shaped conductive support frames to keep and maintain electronic devices including an electronic circuit with the restricted (prevented) radiation of the electronic or electrical field. Also, the present general inventive concept can be applied to an aperture stop which is employed to prevent an unnecessary light radiation generated by optical parts, such as an optical modulator.

In the electronic device having the above-described bezel, a current flowing through the support portion can be restricted (prevented) by providing the separation portion at one or more positions of the support member, the resistor, and/or the inductor at the separation portion. Thus, the bezel can be prevented from functioning as an antenna so that the radiation of the electronic or electrical field can be reduced.

Figure 14:
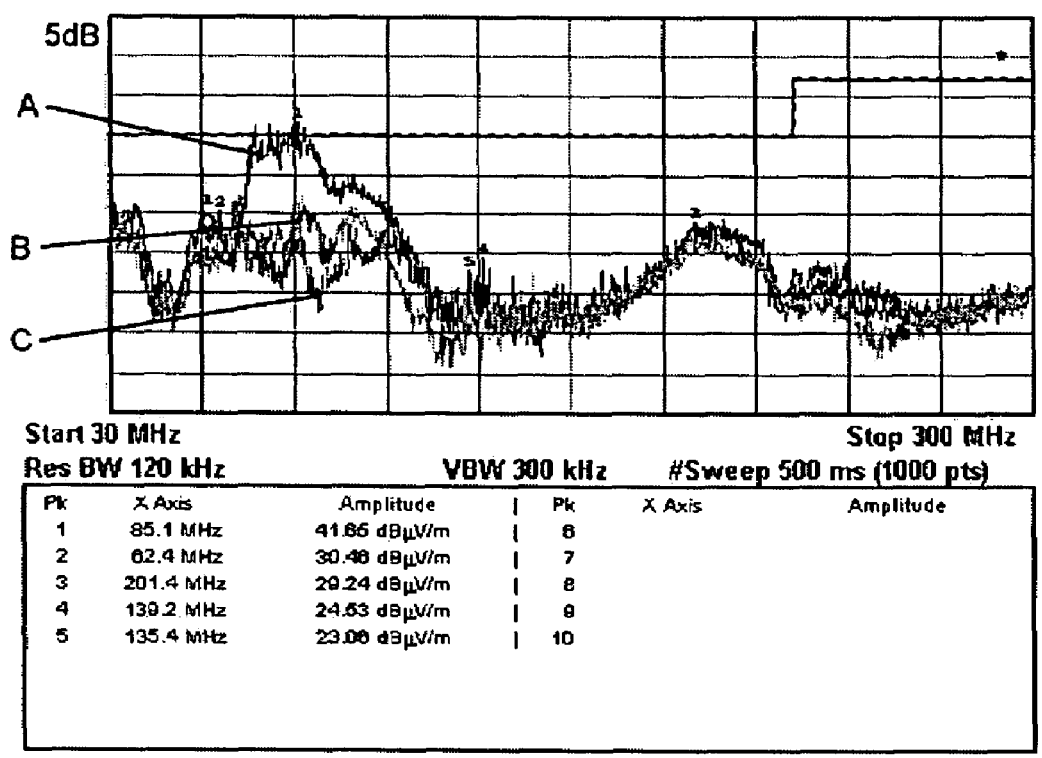
FIG. 14 is a graph illustrating a result of comparison between levels of radiation of electromagnetic waves generated in a conventional electronic device and the embodiment of the present general inventive concept, respectively.

FIG. 14 is a graph illustrating a result of comparison between levels of radiation of electromagnetic waves generated in a conventional bezel of an electronic device and a bezel according to the embodiment of the present general inventive concept, respectively. The graph of FIG. 14 illustrates data obtained by applying the embodiment of present general inventive concept to an LCD projection television with a 50 inch screen.

In the graph, a letter "A" indicates a waveform generated from the conventional bezel, which shows a higher decibel of radiation of the electromagnetic wave than other waves. A letter "B" indicates a waveform generated from the bezel provided with both a resistor and an inductor at each of three separation portions according to the embodiment shown in FIG. 11. A letter "C" indicates a waveform generated from an electronic device in which a bezel structure is not adopted. The waveform indicated by the letter "B" shows that the electromagnetic wave can be radiated at a relatively lower decibel than the waveform indicated by the letter "B," and that the waveform can be similar to that of the electronic device without the bezel structure.

According to an aspect of the present general inventive concept, the electronic device may comprises a television apparatus having the case 11, the installation element 13, such as a screen, installed in the case 11, and the electronic unit 17 provided inside the case 11 as shown in FIGS. 1 and 3. The case 11 may have a wall defining an opening in which the installation element 13 is disposed while the bezel is coupled between the wall of the case 11 and the installation element 13. An image generated using the electronic unit 17 is produced on the installation element 13 through the opening of the case 11.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A bezel used with an electronic and/or electrical device having a case and an installation element disposed in the case, comprising:

a support portion made of a conductive material having a loop shape to be fixedly and supportably coupled to a circumference of the installation element; and a separation portion formed in the support portion between opposing ends of the support portion such that the opposing ends of the support portion are separated by a predetermined distance to restrict formation of an electrical loop, wherein the support portion comprises a groove, a lug disposed in the groove, a first connection element coupled to the lug and one of the opposing ends of the support portion, and a second connection element coupled to the lug and to another one of the opposing ends of the support portion, and at least one of an inductor and a resistor is coupled between the first connection element and the second connection element.

2. The bezel of claim 1, wherein the lug is made of a non-conductive material, and the first and second connection elements are made of a conductive material.

* * * * *